(12) United States Patent
Lee et al.

(10) Patent No.: US 7,986,161 B2
(45) Date of Patent: Jul. 26, 2011

(54) TERMINATION RESISTANCE CIRCUIT

(75) Inventors: Jun-Woo Lee, Gyeonggi-do (KR);
Dae-Han Kwon, Gyeonggi-do (KR);
Taek-Sang Song, Gyeonggi-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 56 days.

(21) Appl. No.: 12/327,294

(22) Filed: Dec. 3, 2008

(65) Prior Publication Data

US 2010/0007375 A1    Jan. 14, 2010

(30) Foreign Application Priority Data

Jul. 14, 2008    (KR) .................. 10-2008-0068186

(51) Int. Cl.
*H03K 17/16* (2006.01)
(52) U.S. Cl. .......................................... 326/30; 326/26
(58) Field of Classification Search ............ 326/30, 326/26, 82–87
See application file for complete search history.

(56) References Cited

U.S. PATENT DOCUMENTS

| | | | | |
|---|---|---|---|---|
| 6,456,124 B1* | 9/2002 | Lee et al. | ...................... | 327/108 |
| 6,894,529 B1* | 5/2005 | Chong et al. | .................... | 326/30 |
| 7,230,449 B2* | 6/2007 | Dreps et al. | ..................... | 326/30 |
| 7,268,712 B1* | 9/2007 | Sheen | ........................... | 341/120 |
| 7,362,128 B2* | 4/2008 | Choi et al. | ....................... | 326/30 |
| 7,463,053 B2* | 12/2008 | Chun | ............................... | 326/30 |
| 7,495,469 B2* | 2/2009 | Park | ................................. | 326/30 |
| 7,573,288 B2* | 8/2009 | Ayyapureddi et al. | .......... | 326/30 |
| 7,692,446 B2* | 4/2010 | Lee et al. | ......................... | 326/30 |
| 2008/0048714 A1* | 2/2008 | Lee et al. | ......................... | 326/30 |

FOREIGN PATENT DOCUMENTS

KR    1020070036578 A    4/2007
KR    1020070081881 A    8/2007

OTHER PUBLICATIONS

Notice of Preliminary Rejection issued from Korean Intellectual Property Office on Jul. 30, 2009 with an English Translation.

* cited by examiner

*Primary Examiner* — Rexford N Barnie
*Assistant Examiner* — Crystal L Hammond
(74) *Attorney, Agent, or Firm* — IP & T Group LLP

(57) ABSTRACT

A termination resistance circuit includes a control signal generator for generating a control signal whose logical value changes when a calibration code has a predetermined value, a plurality of parallel resistors which are respectively turned on/off in response to the calibration code, and a resistance value changing unit for changing the total resistance value of the termination resistance circuit in response to the control signal.

23 Claims, 12 Drawing Sheets

TERMINATION RESISTANCE CIRCUIT

CROSS-REFERENCE TO RELATED APPLICATIONS

This application claims priority to Korean patent application No. 10-2008-0068186, filed on Jul. 14, 2008, which is incorporated by reference in its entirety.

BACKGROUND OF THE INVENTION

The present subject matter relates to a termination resistance circuit which is used for a calibration circuit, an output driver, etc., and more particularly, to a technique for improving resolution while increasing the resistance value range of a termination resistance circuit.

A variety of semiconductor devices embodied by an integrated circuit chip, such as a CPU, a memory and a gate array, have been combined in electrical products such as a personal computer, a server and a work station. In most cases, the semiconductor devices are provided with a receiving circuit for receiving signals from the outside through input pads and an output circuit for providing internal signals to the outside through output pads.

As the operating speed of electronic products becomes faster, a swing width of signals interfaced between the semiconductor devices decreases for minimizing delay time taken for signal transmission. However, as the swing width decreases, external noise interference increases and signal reflection due to impedance mismatching at an interface stage becomes critical.

Such impedance mismatching may be caused by external noise, variation of power supply voltage, changes in operating temperature, and variations during manufacturing processes. If the impedance mismatching is created, it is difficult to transmit the data at high speed and the data outputted from an output terminal of the semiconductor device may be distorted. Therefore, in case that the semiconductor device at the receiving side receives the distorted output signal through its input terminal, the problems such as setup/hold failure or misjudgment of an input level may be caused frequently.

In particular, the semiconductor device, in which the high speed operation is required, employs an impedance matching circuit, which is called on-die termination, in the vicinity of a pad within the integrated circuit chip in order to solve the aforementioned problems. Generally, according to the on-die termination scheme, a source termination is carried out at the transmitting side by the output circuit and a parallel termination is performed at the receiving side by a termination circuit which is coupled in parallel to a receiving circuit connected to the input pad.

Meanwhile, a ZQ calibration refers to a process of generating calibration codes which are varied with Process, Voltage, and Temperature (PVT) conditions. The termination resistance is calibrated by using the calibration codes which are generated by the result of the ZQ calibration.

Hereinafter, a calibration circuit for generating calibration codes and a termination circuit for terminating input/output nodes by using the generated calibration codes will be described in detail.

FIG. 1 is a block diagram of a conventional calibration circuit.

Referring to FIG. 1, the conventional calibration circuit includes a first pull-up termination resistance circuit 110, a second pull-up termination resistance circuit 120, a pull-down termination resistance circuit 130, a reference voltage generator 102, comparators 103 and 104, and counters 105 and 106.

In operation, the comparator 103 compares a voltage of a ZQ node, which is generated by dividing a voltage between a reference resistor 101 (generally, 240Ω) and the first pull-up termination resistance circuit 110, with a reference voltage VREF (generally, set to ½VDDQ) generated from the reference voltage generator 102, to thereby generate an up/down signal UP/DOWN.

The counter 105 receives the up/down signals and then generates a pull-up calibration code PCODE<0:N>. The generated pull-up calibration code PCODE<0:N> turns on/off parallel transistors in the first pull-up termination resistance circuit 110, thereby calibrating the resistance of the first pull-up termination resistance circuit 110. The calibrated resistance of the first pull-up termination resistance circuit 110 affects the voltage at the ZQ node, and this operation is repeated. As a result, the pull-up calibration code PCODE<0:N> is counted until the total resistance value of the first pull-up termination resistance unit 110 becomes identical to the resistance value of the external resistance 101, which is called a pull-up calibration.

The pull-up calibration code PCODE<0:N> generated by the pull-up calibration process is then inputted to the second pull-up termination resistance circuit 120 to determine the total resistance value of the second pull-up termination resistance circuit 120. Similar to the pull-up calibration, a pull-down calibration starts in such a manner that a voltage of a node A becomes the same as the reference voltage VREF by using the comparator 104 and the counter 106. In other words, a pull-down calibration is performed such that the total resistance value of the pull-down termination resistance circuit 130 becomes the same as that of the second pull-up termination resistance circuit 120.

The calibration codes PCODE<0:N> and NCODE<0:N> resulting from the ZQ calibration are then inputted to a termination circuit (shown in FIG. 2), so as to calibrate the termination resistance values.

FIG. 2 is a block diagram of a conventional termination circuit.

The termination circuit refers to a circuit for terminating actual input/output pads by receiving the calibration codes PCODE<0:N> and NCODE<0:N> generated from the calibration circuit as shown in FIG. 1. Shown in FIG. 2 is an output driver of a memory device as an example of the termination circuit.

In a semiconductor memory device, the output driver is a portion for outputting data, and, as shown in FIG. 2, includes pre-drivers 210 and 220 provided at the up and down stages, a pull-up termination resistance circuit 230 and a pull-down termination resistance circuit 240 for outputting data. The pull-up termination resistance circuit 230 and the pull-down termination resistance circuit 240 of the output driver have the same configuration as the pull-up termination resistance circuit 110 and the pull-down termination resistance circuit 130 of the calibration circuit.

In brief operation, the pre-drivers 210 and 220 provided at the up and down stages control the pull-up termination resistance circuit 230 and the pull-down termination resistance circuit 240, respectively. When outputting 'high' data, the pull-up termination resistance circuit 230 is turned on to bring a data pin DQ to 'high' state, and when outputting 'low' data, the pull-down termination resistance circuit 240 is turned on to bring the data pin DQ to 'low' state. That is, the data pin DQ needs to be terminated by pull-up or pull-down to output 'high' or 'low' data.

At this moment, the pull-up calibration code PCODE<0:N> and the pull-down calibration code NCODE<0:N> determine which resistors to turn on among the parallel resistors in the pull-up termination resistance circuit 230 and the pull-down termination resistance circuit 240 that are turned on. That is, while whether to turn on the pull-up termination resistance circuit 230 and whether to turn on the pull-down termination resistance circuit 240 are determined depending on a logic state of output data, the on/off of each of the resistors in the termination resistance circuits 230 and 240 to be turned on is determined by the calibration codes PCODE<0:N> and NCODE<0:N>.

For reference, target resistance values of the pull-up termination resistance circuit 230 and the pull-down termination resistance circuit 240 are not always identical to the resistance values (240Ω) of the calibration resistance circuits (110, 120, and 130 in FIG. 1), but may have a value of 120Ω and 60Ω which is ½ and ¼ of 240Ω.

For instance, when two resistance circuits 230 and 240 of 240Ω are connected in parallel, they will have a resistance value of 120Ω, and when four are connected in parallel, they will have a resistance value of 60Ω.

DQp_CTRL and DQn_CTRL inputted to the pre-drivers 210 and 220 of FIG. 2 represent a bundle of various control signals inputted to the pre-drivers 210 and 220.

The calibration code PCODE<0:N> is also inputted to an on-die termination resistance circuit at an input buffer side. The input buffer side may perform only pull-up termination or only pull-down termination of input/output pads DQ based on the type and specification of a memory device. In this case, only the pull-up calibration code PCODE<0:N> or pull-down calibration code NCODE<0:N> is used. The on-die termination resistance circuit provided at the input buffer side also has the same configuration as the termination resistance circuits 110, 120, 130, 230, and 240 as illustrated above.

Depending on the type of a memory device, the output driver plays a role of the on-die termination resistance circuit of the input buffer. This is because the output driver plays a role of terminating the input/output pads DQ as well (however, the resistance values may be varied depending on regulations).

FIG. 3 illustrates in more detail the termination resistance circuits 110, 120, 130, 230, and 240.

The upper part of the drawing illustrates the pull-up termination resistance circuit 110, 120, and 230 whose resistance value is determined upon receipt of the pull-up calibration code PCODE<0:6>, and the lower part of the drawing illustrates the pull-down termination circuit 130 and 240 whose resistance value is determined upon receipt of the pull-down calibration code NCODE<0:6>.

The termination resistance circuits 230 and 240 used for the output driver (FIG. 2) does not directly receive the calibration codes PCODE<0:6> and NCODE<0:6>, and are controlled by the pre-drivers 210 and 220. However, when the pre-drivers 210 and 220 turn on the corresponding termination resistance circuits 230 and 240, the calibration codes PCODE<0:6> and NCODE<0:6> received by themselves are directly transmitted to the termination resistance circuits 230 and 240. Thus, in FIG. 3, the illustration is made with respect to a case where the termination resistance circuits 230 and 240 also receive the calibration codes PCODE<0:6> and NCODE<0:6>.

The parallel resistors in the termination resistance circuits 110, 120, 130, 230, and 240 have their respective binary weights. That is, the resistance values of the parallel resistors in the resistance circuits 110, 120, 130, 230, and 240 are different from each other, so that the resistance circuits 110, 120, 130, 230, and 240 can have more various resistance values. Of course, all the parallel resistors in the termination resistance circuits may be designed to have the same resistance value. In this case, however, the termination resistance circuits 110, 120, 130, 230, and 240 have less various resistance values.

FIG. 4 illustrates a case that the termination resistance circuits 110, 120, 130, 230, and 240 have resistors that are always turned on upon operation of the resistance circuits.

Referring to FIG. 4, the termination resistance circuits 110, 120, 130, 230, and 240 may be designed to have resistors that are always turned on upon operation.

Referring to FIG. 3, the resistors receiving PCODE<6> and NCODE<6> which are Most Significant Bit (MSB) codes among the calibration codes will be almost always turned on. This is because variations of the resistance values will be very large even if the resistors receiving PCODE<6> and NCODE<6> are turned off.

Accordingly, if the resistors are always turned on during operation, it is advantageous to have resistors that are controlled not by the calibration codes PCODE<6> and NCODE<6> but by other signals ON/OFF_U and ON/OFF_D. This is because a memory device requires a lot of transmission lines to transmit the calibrations codes PCODE<0:N> and NCODE<0:N> to the output driver provided in a plurality of DQ pads (where a recent memory is provided with 32 DQ pads) from the calibration circuit in the vicinity of a ZQ pad, and if the number of bits of the calibration codes PCODE<0:N> and NCODE<0:N> can be decreased, the number of transmission lines can also be decreased as much.

However, since the entire resistors in the resistance circuits 110, 120, 130, 230, and 240 may not be operated regardless of the calibration codes PCODE<0:N> and NCODE<0:N>, the termination resistance circuits 110, 120, 130, 230, and 240 are configured such that the resistors which are always turned on upon operation are turned on/off by control of the signals ON/OFF_U and ON/OFF_D.

For instance, the pull-up termination resistance circuit 230 of the output driver is operated when outputting 'high' data, while it is not operated when outputting 'low' data. Thus, the signal ON/OFF_U turns on the resistors controlled by itself only when outputting 'high' data, whereas the signal ON/OFF_U turns off the resistors controlled by itself when outputting 'low' data.

Likewise, the pull-down termination resistance circuit 240 of the output driver is operated when outputting 'low' data, while it is not operated when outputting 'high' data. Thus, the signal ON/OFF_D turns on the resistors controlled by itself only when outputting 'low' data, while the signal ON/OFF_D turns off the resistors controlled by itself when outputting 'high' data.

FIGS. 5A and 5B illustrate the range of resistance values of the termination resistance circuits 110, 120, 130, 230, and 240.

FIG. 5A shows the range of resistance values of the termination resistance circuits 110, 120, 130, 230, and 240 as the calibration codes PCODE<0:N> and NCODE<0:N> are varied under a typical condition. As shown in FIG. 5A, a target resistance value is within the range of resistance values available for the termination resistance circuits 110, 120, 130, 230, and 240.

FIG. 5B shows the range of resistance values of the termination resistance circuits 110, 120, 130, 230, and 240 as the calibration codes PCODE<0:N> and NCODE<0:N> are varied under the worst condition. Here, the worst condition refers to a case that the respective resistance values of the parallel resistors in the termination resistance circuits 110, 120, 130, 230, and 240 are changed greatly due to variations of the PVT condition. In this case, the range of resistance values of the termination resistance circuits 110, 120, 130, 230, and 240 is quite different from that of the typical condition, and, as shown in FIG. 5B, a target resistance value may not be included within the range of resistance values of the termination resistance circuits 110, 120, 130, 230, and 240. In this case, the termination resistance circuits 110, 120, 130, 230, and 240 do not have appropriate resistance values, so that data transmission/reception is not properly performed.

This problem can be solved by increasing the range of resistance values of the termination resistance circuits 110, 120, 130, 230, and 240. However, the range of resistance values of the termination resistance circuits 110, 120, 130, 230, and 240 is in a trade-off relationship with the resolution of the resistance circuits 110, 120, 130, 230, and 240.

If the total resistance value of the resistance circuits 110, 120, 130, 230, and 240 is designed to be slightly changed each time the respective calibration codes PCODE<0:N> and NCODE<0:N> are increased or decreased one by one, the resolution of the termination circuits 110, 120, 130, 230, and 240 increases but the range of resistance values available for the resistance circuits 110, 120, 130, 230, and 240 decreases. However, if the resistance values of the resistance circuits 110, 120, 130, 230, and 240 are designed to be changed greatly each time the respective calibration codes PCODE<0:N> and NCODE<0:N> are increased or decreased one by one, the range of resistance values of the resistance circuits 110, 120, 130, 230, and 240 increases but the resistance values of the resistance circuits 110, 120, 130, 230, and 240 cannot be finely calibrated.

As a method for increasing the range of resistance values of the resistance circuits 110, 120, 130, 230, and 240 while maintaining a constant resolution, there can be considered a method of increasing the number of bits of the calibration codes PCODE<0:N> and NCODE<0:N> and increasing the number of parallel resistors in the resistance circuits 110, 120, 130, 230, and 240. However, this method increases the area of the calibration circuit (in FIG. 1), increases the number of transmission lines for transmission of the calibration codes PCODE<0:N> and NCODE<0:N>, and increases the area of the output driver (in FIG. 2, a memory device has 32 output drivers), which thereby causes a serious drawback in terms of the area of a semiconductor device.

SUMMARY OF THE INVENTION

Embodiments of the present subject matter are directed to providing a termination resistance circuit which has a high resolution and a wide range of resistance values even in a state that the area of the circuit is not increased.

In accordance with an aspect of the disclosure, there is provided a termination resistance circuit, including: a control signal generator for generating a control signal whose logical value changes when a calibration code has a predetermined value; a plurality of parallel resistors which are respectively turned on/off in response to the calibration code; and a resistance value changing unit for changing the total resistance value of the termination resistance circuit in response to the control signal.

In accordance with another aspect of the disclosure, there is provided a termination resistance circuit, including: a plurality of parallel resistors which are respectively turned on/off in response to a calibration code, wherein, when the calibration code has a predetermined code value, a resistance value of at least one of the plurality of parallel resistors is changed.

In accordance with another aspect of the disclosure, there is provided a termination resistance circuit, including: a plurality of parallel resistors which are respectively turned on/off in response to a calibration code; and a reference resistor whose on/off state is changed when the calibration code has a predetermined code value.

In accordance with another aspect of the disclosure, there is provided a termination resistance circuit, including: a plurality of parallel resistors which are respectively turned on/off in response to a calibration code; and a reference resistor for maintaining the range of resistance value of the termination resistance circuit, wherein a resistance value of the reference resistor is changed when the calibration code has a predetermined code value.

DESCRIPTION OF SPECIFIC EMBODIMENTS

Hereinafter, the most preferred embodiments of the present subject matter will be described in detail with reference to the accompanying drawings so that the technical aspects of the invention can easily be practiced by those skilled in the art.

For reference, a resistor used in the present subject matter does not mean only a passive device only made from a resistive material, but includes a transistor, a diode, and the like which are designed to operate as a resistor.

Figure 1:
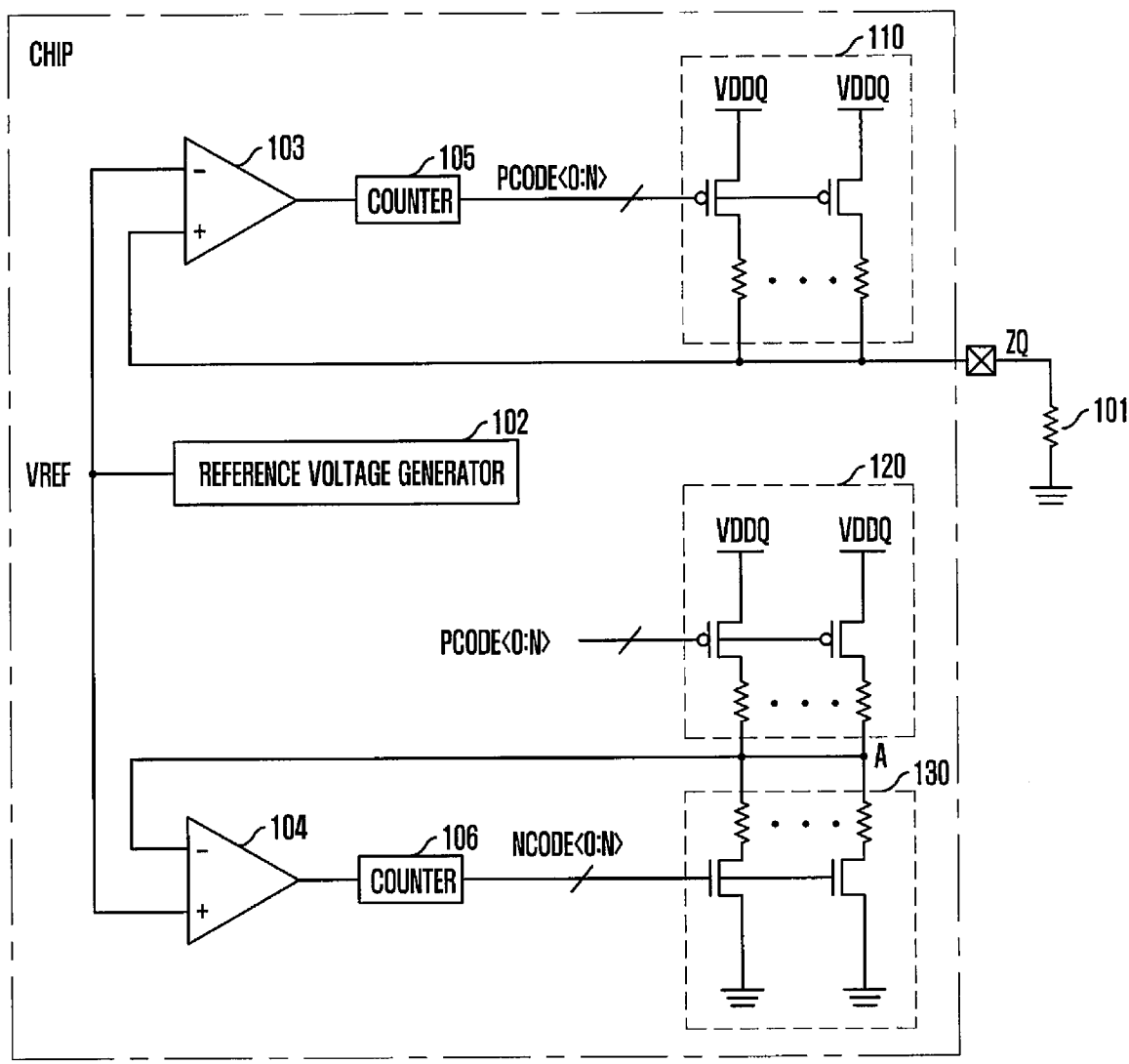
FIG. 1 is a diagram showing the configuration of a conventional calibration circuit.
Figure 2:
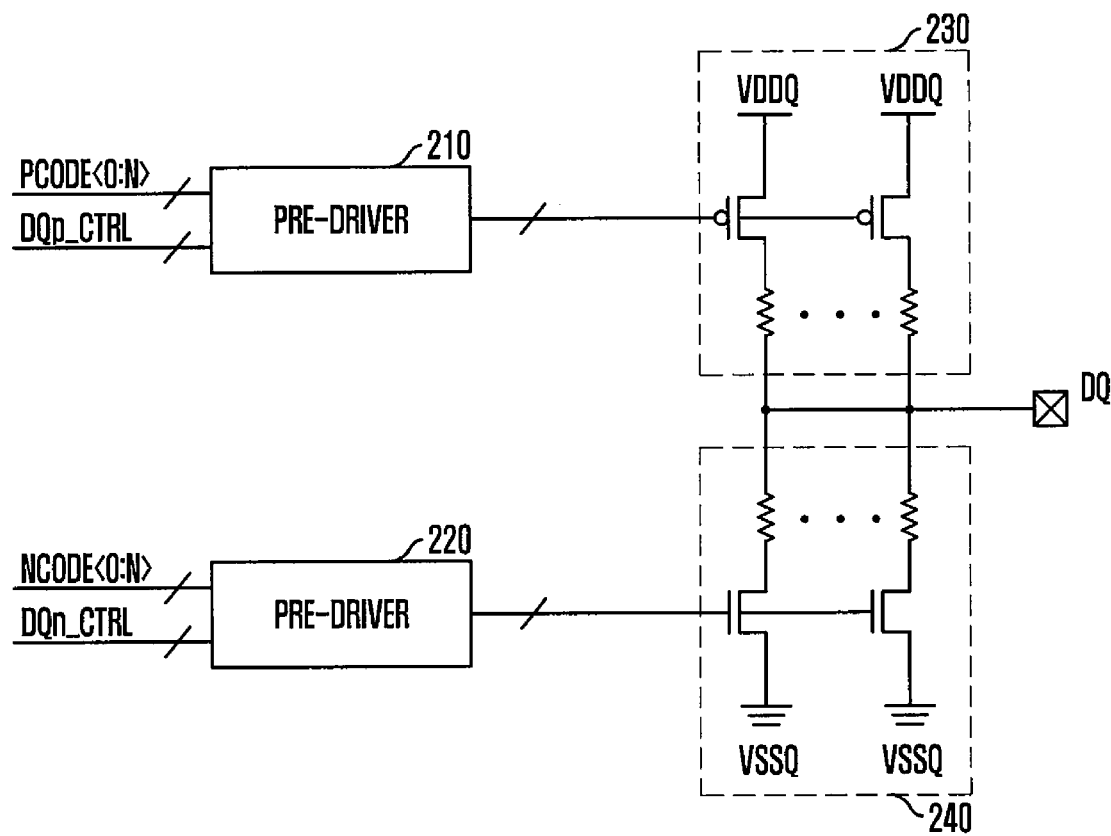
FIG. 2 is a diagram showing the configuration of a conventional termination circuit.
Figure 3:
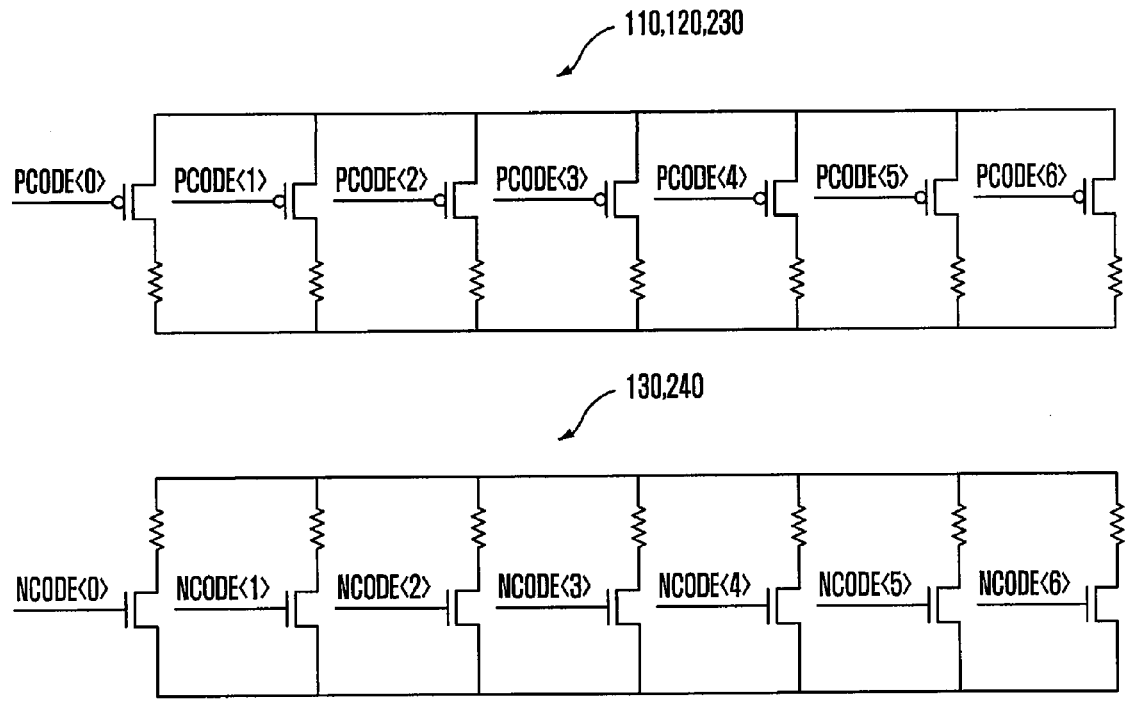
FIG. 3 illustrates more details of the termination resistance circuits 110, 120, 130, 230 and 240.
Figure 4:
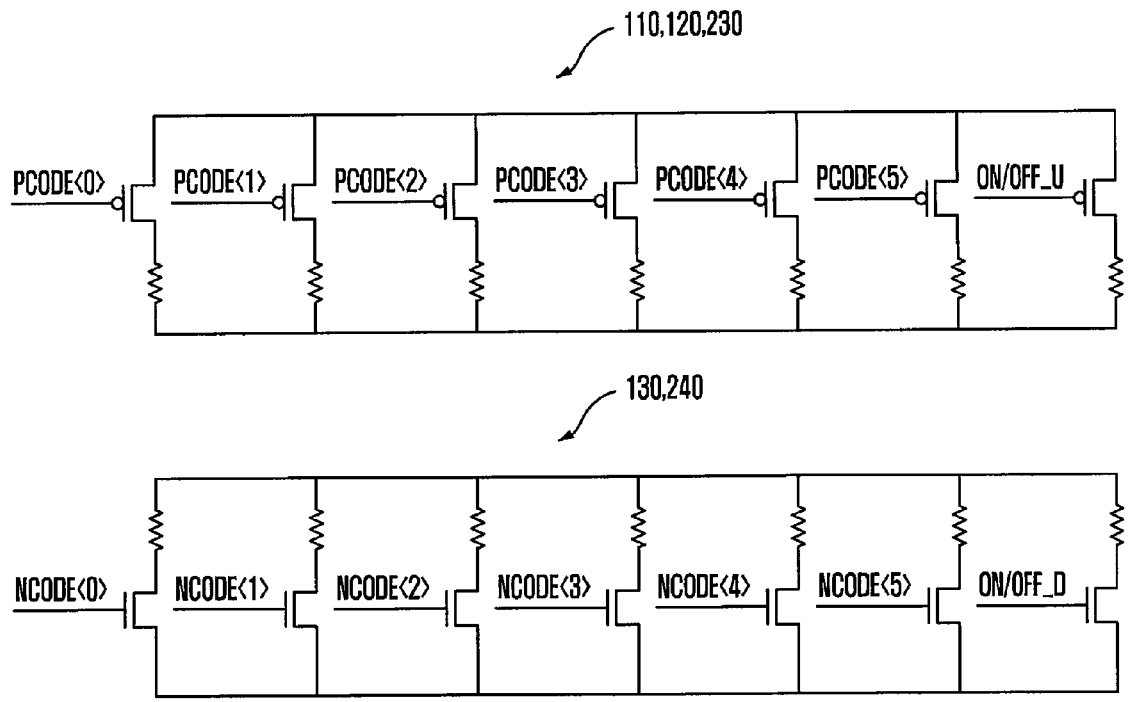
FIG. 4 illustrates a case that the termination resistance circuits 110, 120, 130, 230 and 240 have resistors that are always turned on upon operation of the resistance circuits.
Figure 5A:
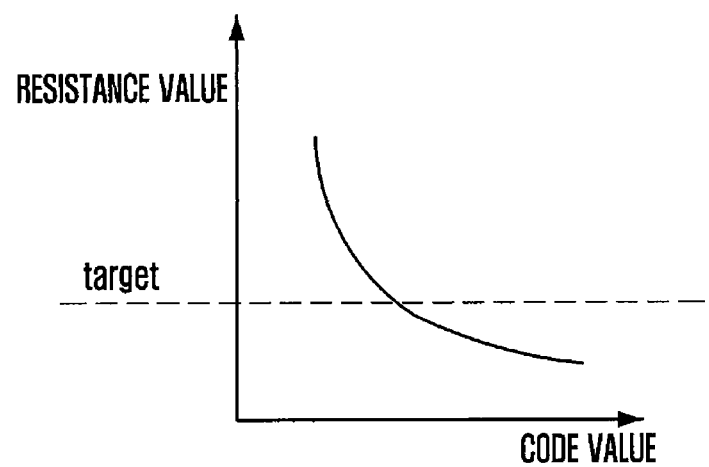
FIGS. 5A and 5B illustrate the range of resistance values of the termination resistance circuits 110, 120, 130, 230 and 240.
Figure 5B:
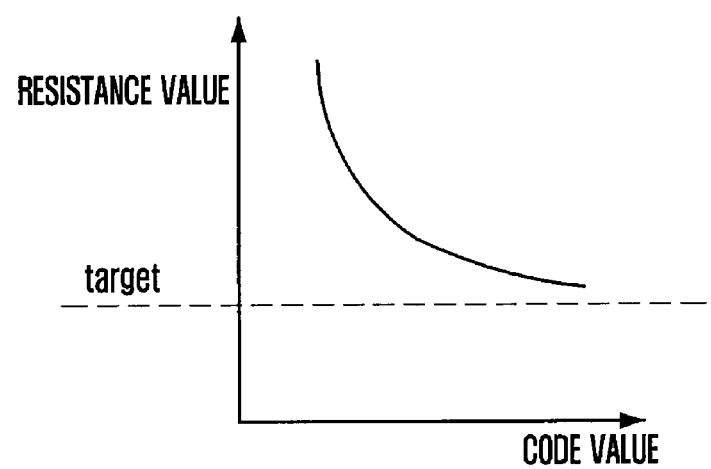
Figure 6:
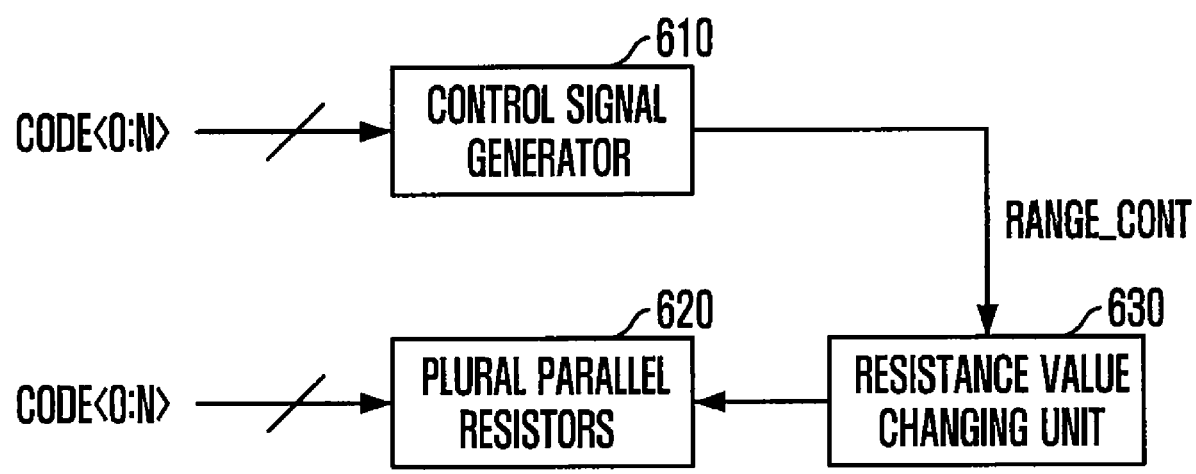
FIG. 6 is a conceptual view of a termination resistance circuit in accordance with the present subject matter.

FIG. 6 is a conceptual view of a termination resistance circuit in accordance with the present subject matter.

The termination resistance circuit in accordance with the present subject matter includes a control signal generator 610 for generating a control signal RANGE_CONT whose logical value changes if a calibration code CODE<0:N> has a predetermined value, a plurality of parallel resistors 620 which are respectively turned on/off in response to the calibration code CODE<0:N>, and a resistance value changing unit 630 for changing the total resistance value of the termination resistance circuit in response to the control signal RANGE_CONT. Here, a term "a calibration code" may be more than one calibration codes.

The termination circuit of the present subject matter is similar to the conventional termination circuit in that a plurality of parallel resistors 620 are respectively turned on/off in response to the calibration code CODE<0:N>. However, the present subject matter further includes the control signal generator 610 and the resistance value changing unit 630.

The control signal generator 610 changes a logic level of the control signal RANGE_CONT when a code value of the calibration code CODE<0:N> reaches a predetermined value, and maintains the changed logic level until the termination resistance circuit is reset. The resistance value changing unit 630 changes the total resistance value of the termination resistance circuit in response to the logic level of the control signal RANGE_CONT. The control signal generator 610 may be provided for each termination resistance circuit, or may be designed such that several termination resistance circuits share one control signal generator 610.

It is assumed that the termination resistance circuit is a resistance circuit including pull-up parallel resistors 620 and uses pull-up calibration codes PCODE<0:N> for illustration. If a target resistance is 190Ω and the range of resistance values of the termination resistance circuit ranges from 200 to 400Ω, the pull-up calibration codes all have a value of '0.' However, even if the pull-up calibration codes all have a value of '0' and all the resistors 620 are turned on, the termination resistance circuit has a resistance value not more than 200Ω.

In this case, the control signal generator 610 changes the level of the control signal RANGE_CONT. Then, the resistance value changing unit 630 changes the total resistance value of the termination resistance circuit. That is, the range of resistance values of the termination resistance circuit is changed from the range of 200 to 400Ω to the range of 180 to 380Ω. Therefore, the termination resistance circuit can have a resistance value of 190Ω, which is a target resistance value.

On the contrary, if the target resistance value is 410Ω and the termination resistance circuit is designed to have a resistance value of 200 to 400Ω, it may be designed such that the logic level of the control signal RANGE_CONT can be changed when the calibration code PCODE<0:N> has a code value for providing a resistance value of 400Ω, and the resistance value changing unit 630 can make the termination resistance circuit have a resistance value of 220 to 420Ω.

That is to say, the control signal generator 610 and the resistance value changing unit 630 may be designed such that the termination resistance circuit have a lower range of resistance values than the initial range of resistance values (200 to 400Ω->180 to 380Ω) or such that the termination resistance circuit has a higher range of resistance values than the initial range of resistance values (200~400Ω->220~420Ω).

In the former case, the control signal generator 610 may be designed to generate a control signal RANGE_CONT so that the resistance value changing unit 630 decreases the total resistance value of the termination resistance circuit when the calibration code CODE<0:N> is a code for making the total resistance value of the plurality of parallel resistors 620 below a predetermined value. In the latter case, the control signal generator 610 may be designed to generate a control signal RANGE_CONT so that the resistance value changing unit 630 increases the total resistance value of the termination resistance circuit when the calibration code CODE<0:N> is a code for making the total resistance value of the plurality of parallel resistors 620 above a predetermined value.

For reference, in theory, if all the parallel resistors 620 of the termination resistance circuit are turned off, the termination resistance circuit can have an infinite resistance value. Thus, the upper limit of the above-explained resistance values of 400Ω, 380Ω, and 420Ω means the upper limit of resistance values that the termination resistance circuit can have while maintaining a certain degree of resolution (for example, a resistance value when at least one resistor is turned on)

The resistance value changing unit 630 may be implemented to be positioned in the plurality of parallel resistors 620, or may be implemented to be positioned outside of the plurality of parallel resistors 620. A more detailed description thereon will be given along with the embodiments to be described later.

Figure 7A:
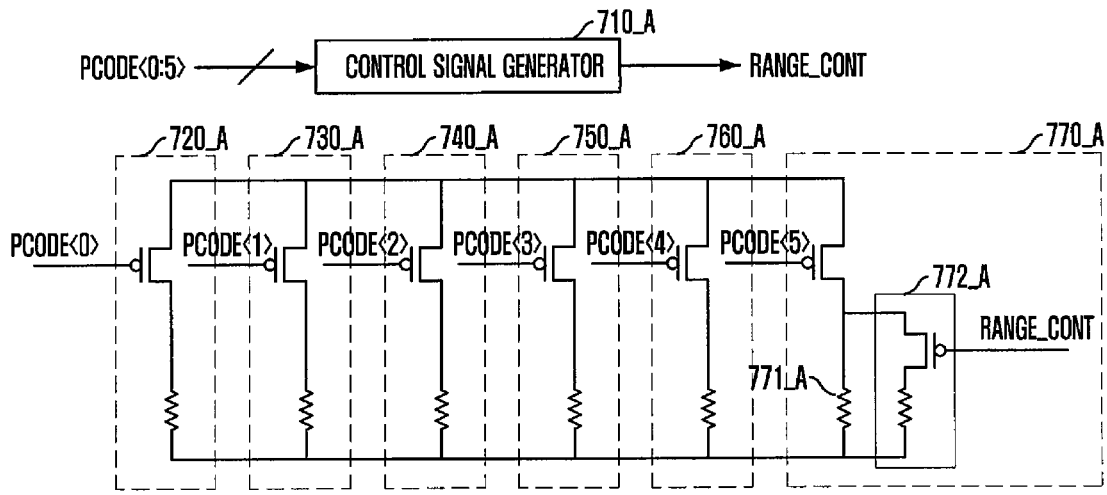
FIGS. 7A and 7B illustrates a termination resistance circuit in accordance with a first embodiment of the present subject matter.
Figure 7B:
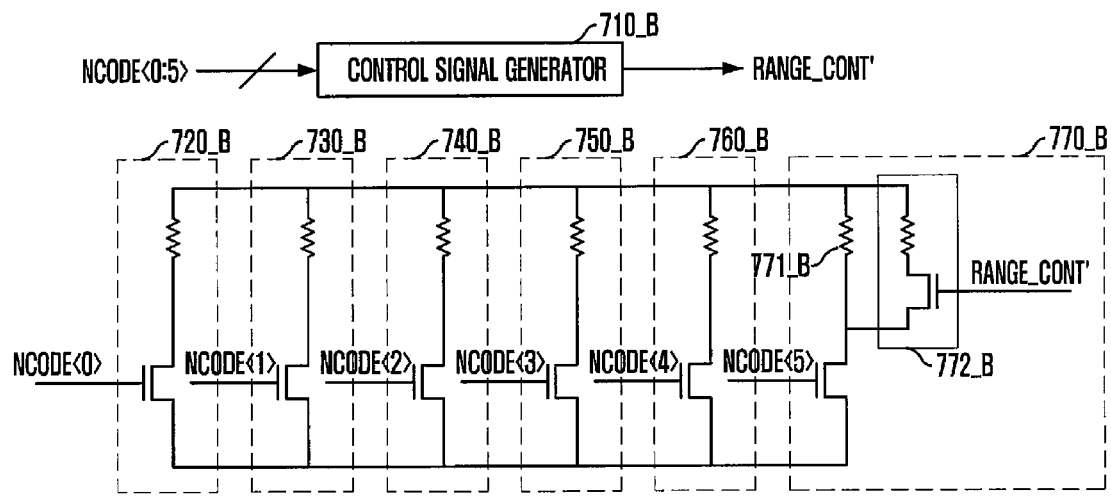

FIGS. 7A and 7B illustrate a termination resistance circuit in accordance with a first embodiment of the present subject matter.

FIG. 7A illustrates a case that the termination resistance circuit is a pull-up termination resistance circuit, and FIG. 7B illustrates a case that the termination resistance circuit is a pull-down termination resistance circuit. Both of them basically have the same configuration except that they are different in the type of transistors used and the codes PCODE and NCODE inputted. Of course, the termination resistance circuit of FIG. 7A may be used as a pull-down termination resistance circuit, and the termination resistance circuit of FIG. 7B may be used as a pull-up termination resistance circuit, ignoring deterioration in characteristics.

FIGS. 7A and 7B are different only in that the levels of input signals are different from each other due to the difference in the type of transistors used. Hence, the termination resistance circuit in accordance with the first embodiment will now be described with reference to FIG. 7A.

The termination resistance circuit in accordance with the first embodiment includes a plurality of parallel resistors 720_A~770_A turned on/off in response to their calibration code PCODE<0:5>, and is characterized in that when the calibration code PCODE<0:5> has a predetermined value, the resistance value of at least one parallel resistor 770_A of the plurality of parallel resistors 720_A~770_A is changed. When comparing FIG. 7A with FIG. 6, the resistance value changing unit 630 may be included in the parallel resistor 770_A.

When the calibration code PCODE<0:5> has a predetermined code value, the control signal generator 710_A changes the level of the control signal RANGE_CONT. Thus, the on/off state of a calibration resistor 772_A is inverted.

It is assumed that the calibration code PCODE<0:5> reaches a predetermined code value (e.g., <0,0,0,0,0,0>) and the level of the control signal RANGE_CONT is changed from 'high' to 'low.' As the level of the control signal RANGE_CONT is maintained 'high' as an initial value, the parallel resistor 770_A has only a resistance value caused by a basic resistor 771_A. Then, when the calibration code PCODE<0:5> becomes <0,0,0,0,0,0>, the level of the control signal RANGE_CONT is changed to 'low,' and the calibration resistor 772_A is turned on. This increases the number of resistors to be connected in parallel, thereby decreasing the resistance value of the parallel resistor 770_A. The decrease of the resistance value of the parallel resistor 770_A implies that the range of the total resistance value of the calibration resistance circuit is shifted to a lower value (e.g., 200 to 400Ω->180 to 380Ω).

On the contrary, it is assumed that the calibration code PCODE<0:5> reaches a predetermined code value (e.g., <1,1,1,1,1,0>) and the level of the control signal RANGE_CONT is changed from 'low' to 'high'. As the level of the control signal RANGE_CONT is maintained 'low' as an initial value, the parallel resistor 770_A has a resistance value caused by both the basic resistor 771_A and the calibration resistor 772_A. Then, when the calibration code PCODE<0:5> becomes <1,1,1,1,1,0>, the level of the control signal RANGE_CONT is changed to 'high', and the calibration resistor 772_A is turned off. This increases the resistance value of the parallel resistor 770_A. The increase of the resistance value of the parallel resistor 770_A means that the range of the total resistance value of the calibration resistance circuit is shifted to a higher value (e.g., 200 to 400Ω->220 to 420Ω).

Although the drawing has illustrated an example of calibrating the resistance value of the parallel resistor 770_A in a way to connect the calibration resistor 772_A to the basic resistor 771_A in parallel and turn it on/off, it is needless to say that the resistance value of the parallel resistor 770_A may be calibrated by connecting the calibration resistor 772_A to the basic resistor 771_A in series and turning it on/off.

Figure 8A:
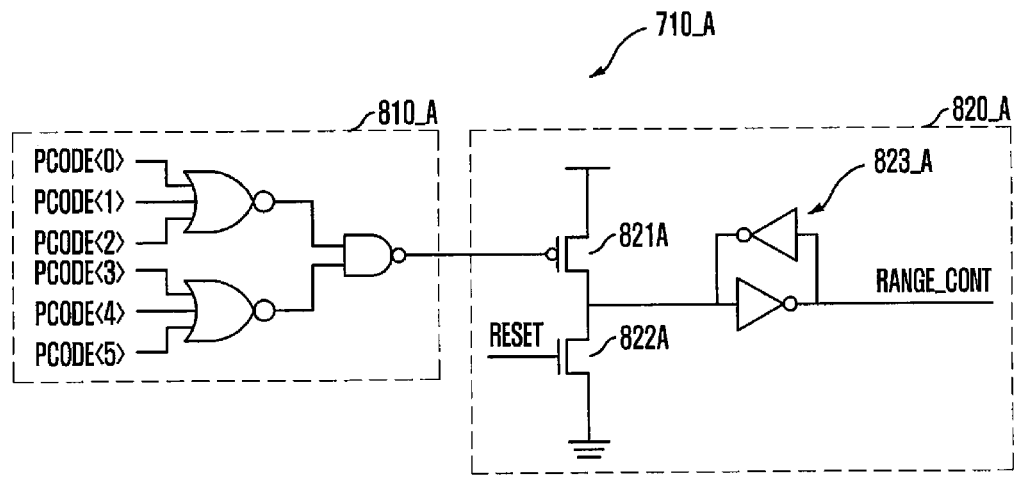
FIGS. 8A and 8B illustrate a first detailed embodiment of the control signal generators 710_A and 710_B illustrated in FIGS. 7A and 7B.
Figure 8B:
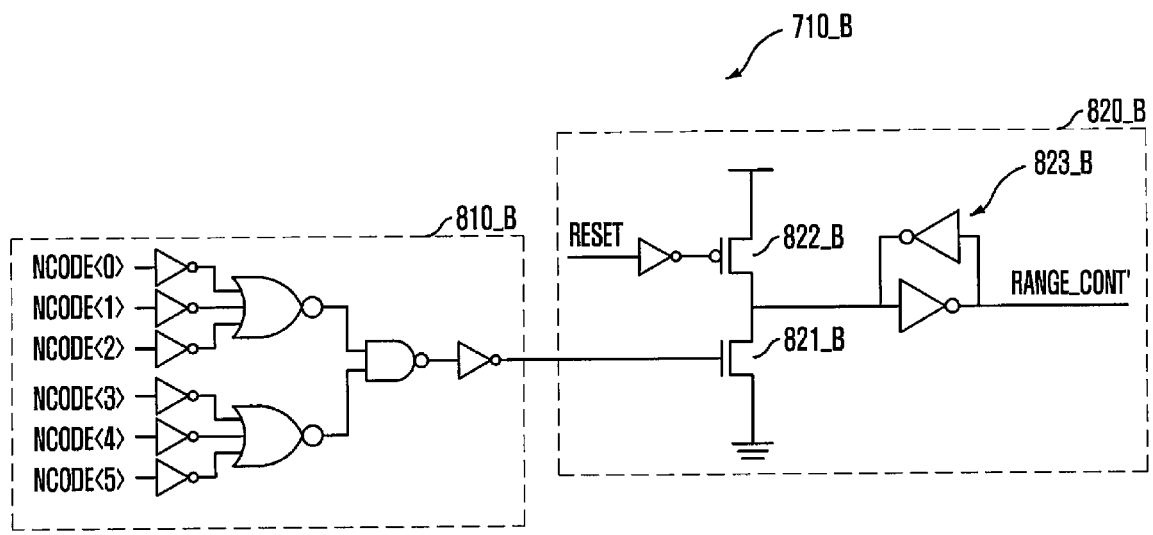

FIGS. 8A and 8B illustrate a first detailed embodiment of control signal generators 710_A and 710_B of FIGS. 7A and 7B.

When the calibration code reaches a predetermined value (e.g., PCODE<0:5>=<0,0,0,0,0,0>, NCODE<0:5>=<1,1,1,1,1,1>), the control signal generators 710_A and 710_B illustrated in FIGS. 8A and 8B generate control signals RANGE_CONT and RANGE_CONT' so that the range of the total resistance value of the calibration circuit is shifted to a lower value (e.g., 200 to 400Ω->180 to 380Ω).

To be more specific, when the calibration code PCODE<0:5> becomes <0,0,0,0,0,0>, the control signal generator 710_A of FIG. 8A changes the control signal RANGE_CONT from 'high' to 'low,' whereas when the calibration code PCODE<0:5> becomes <1,1,1,1,1,1>, the control signal generator 710_B of FIG. 8B changes the control signal RANGE_CONT' from 'low' to 'high.' As the operating principles of the two circuits (FIGS. 8A and 8B) are identical to each other, the configuration and operation of the control signal generators will be described below with reference to FIG. 8A.

As shown in FIG. 8A, the control signal generator 710_A includes a logic combination unit 810_A for logically combining calibration codes PCODE<0:N> to generate a control signal RANGE_CONT and a latch unit 820_A for maintaining the level of the control signal RANGE_CONT until resetting.

If the calibration code PCODE<0:5> is <0,0,0,0,0,0>, the logic combination unit 810_A outputs a 'low' signal to turn on a transistor 821_A, whereas if the calibration code PCODE<0:5> is not <0,0,0,0,0,0>, the logic combination unit 810_A outputs a 'high' signal to turn off the transistor 821_A.

A latch unit 820_A turns on a transistor 822_A by activation of a rest signal RESET, which is enabled upon initiation of the circuit, to thereby bring the control signal RANGE_CONT to 'high' level. The level of the control signal is maintained 'high' by a latch 823_A. Then, when a 'low' signal is outputted from the logic combination unit 810_A, the transistor 821_A is turned on to change the control signal RANGE_CONT to 'low' level. The level of the control signal RANGE_CONT once changed to 'low' is maintained until the circuit is initialized again, that is, until the reset signal RESET is enabled again.

Figure 9A:
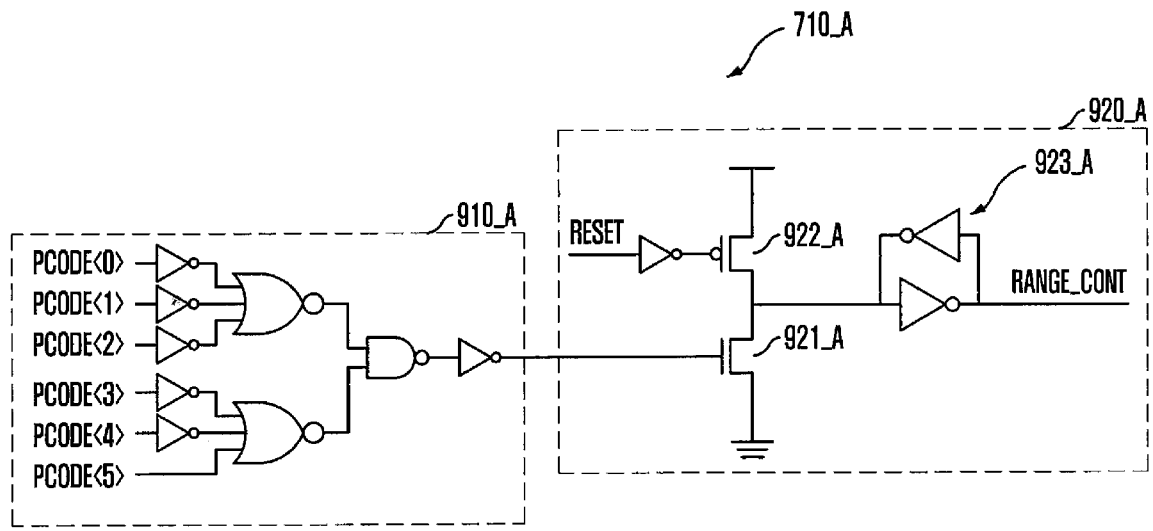
FIGS. 9A and 9B illustrate a second detailed embodiment of the control signal generators 710_A and 710_B illustrated in FIGS. 7A and 7B.
Figure 9B:
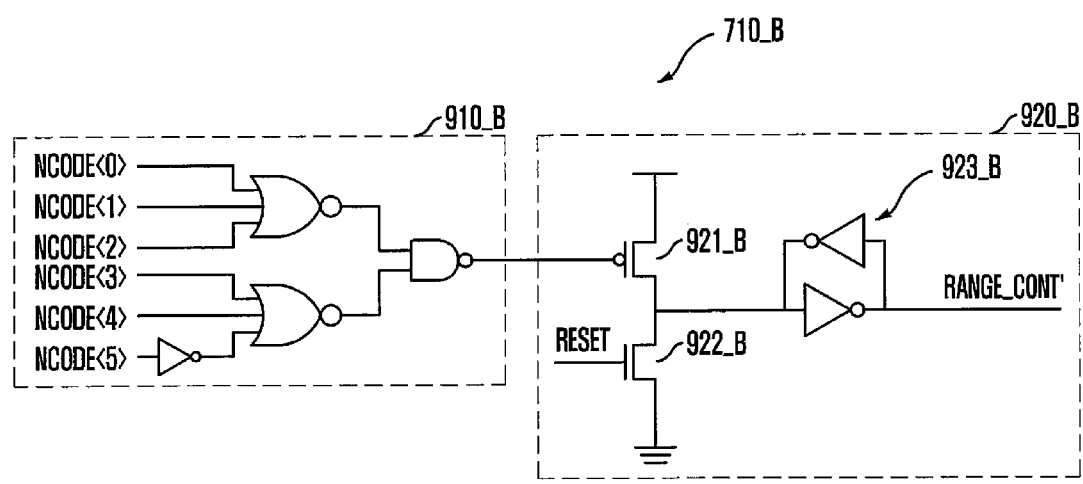

FIGS. 9A and 9B are views of a second detailed embodiment of the control signal generators 710_A and 710_B illustrated in FIGS. 7A and 7B.

When the calibration code reaches a predetermined value (e.g., PCODE<0:5>=<1,1,1,1,1,0>, NCODE<0:5>=<0,0,0,0,0,1>), the control signal generators 710_A and 710_B illustrated in FIGS. 9A and 9B generate control signals RANGE_CONT and RANGE_CONT' so that the range of the total resistance value of the calibration circuit is shifted to a higher value (e.g., 200 to 400Ω->220 to 420Ω).

In detail, when the calibration code PCODE<0:5> becomes <1,1,1,1,1,0>, the control signal generator 710_A of FIG. 9A changes the control signal RANGE_CONT from 'low' to 'high,' whereas when the calibration code PCODE<0:5> becomes <0,0,0,0,0,1>, the control signal generator 710_B of FIG. 9B changes the control signal RANGE_CONT' from 'high' to 'low.' As the operating principle of the two circuits (FIGS. 8A and 8B) are identical to each other, the configuration and operation of the control signal generators will be described hereinafter with reference to FIG. 9A.

As shown in FIG. 9A, the control signal generator 710_A includes a logic combination unit 910_A for logically combining calibration codes PCODE<0:5> to generate the control signal RANGE_CONT and a latch unit 920_A for maintaining the level of the control signal RANGE_CONT until resetting.

If the calibration code PCODE<0:5> is <1,1,1,1,1,0>, the logic combination unit 910_A outputs a 'high' signal to turn on a transistor 921_A, while if the calibration code PCODE<0:5> is not <1,1,1,1,1,0>, the logic combination unit 910_A outputs a 'low' signal to turn off the transistor 921_A.

A latch unit 920_A turns on a transistor 922_A by activation of a rest signal RESET, which is enabled upon initiation of the circuit, to thereby bring the control signal RANGE_CONT to 'low' level. The level of the control signal is maintained 'low' by a latch 923_A. Then, when a 'high' signal is outputted from the logic combination unit 910_A, the transistor 921_A is turned on to change the control signal RANGE_CONT to 'high' level. The level of the control signal RANGE_CONT once changed to 'high' is maintained until the circuit is initialized again, that is, until the reset signal RESET is enabled again.

Figure 10:
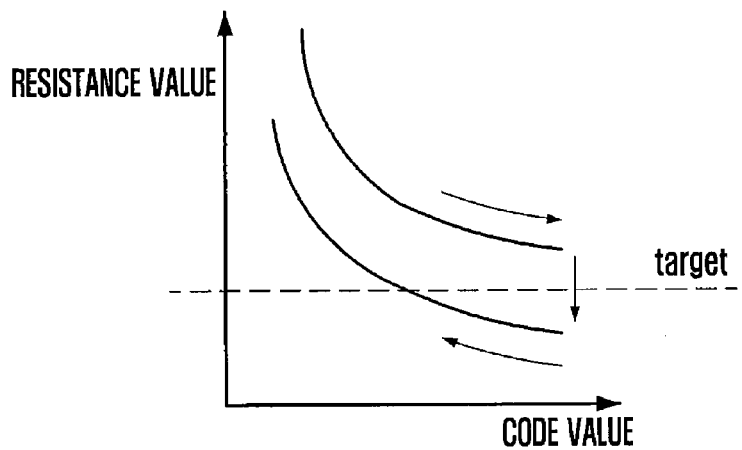
FIG. 10 shows a process in which the resistance value is changed when the termination resistance circuit of FIG. 7A uses the control signal generator 710_A shown in FIG. 8A.

FIG. 10 shows a process in which the resistance value is changed when the termination resistance circuit of FIG. 7A uses the control signal generator 710_A shown in FIG. 8A.

If a target resistance is 190Ω, the calibration code PCODE<0:5> becomes <0,0,0,0,0,0>. Thus, even if all the parallel resistors 720_A~770_A are turned on, the termination resistance circuit has a resistance value of no more than 200Ω. In this circumstance, if the level of the control signal RANGE_CONT is changed, the range of resistance values of the termination resistance circuit is lowered. As a result, the termination resistance circuit has a resistance value of 190Ω.

The arrow in FIG. 10 shows a process in which the resistance value of the termination resistance circuit is changed.

Figure 11:
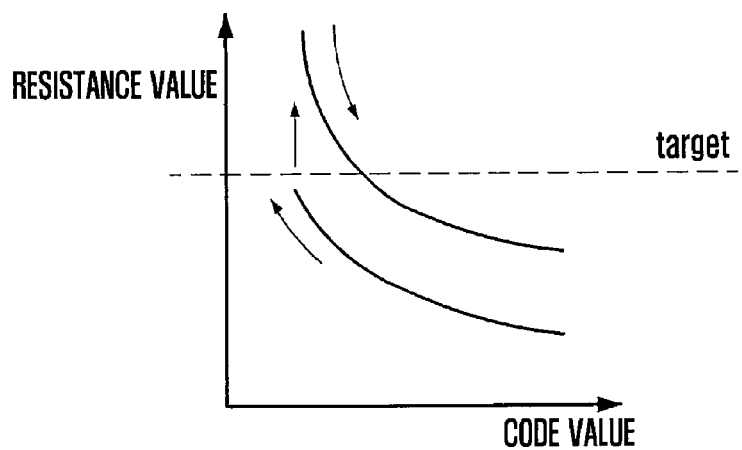
FIG. 11 shows a process in which the resistance value is changed when the termination resistance circuit of FIG. 7A uses the control signal generator shown in FIG. 9A.

FIG. 11 shows a process in which the resistance value is changed when the termination resistance circuit of FIG. 7A uses the control signal generator shown in FIG. 9A.

An effective range of resistance values of the termination resistance circuit (a range capable of providing a resistance value while maintaining a certain degree of resolution) is up to 400Ω. Thus, if a target resistance value is 410Ω, the termination resistance circuit cannot support an appropriate target resistance value. The calibration code PCODE<0:N> is changed in a direction which increases the resistance value of the termination resistance circuit, and when it becomes a code value of <1,1,1,1,1,0>, the level of the control signal RANGE_CONT is changed. Hence, the range of resistance values of the termination resistance circuit is raised. As a result, the termination resistance circuit has a resistance value of 410Ω.

The arrow in FIG. 11 shows a process in which the resistance value of the termination resistance circuit is changed.

Figure 12A:
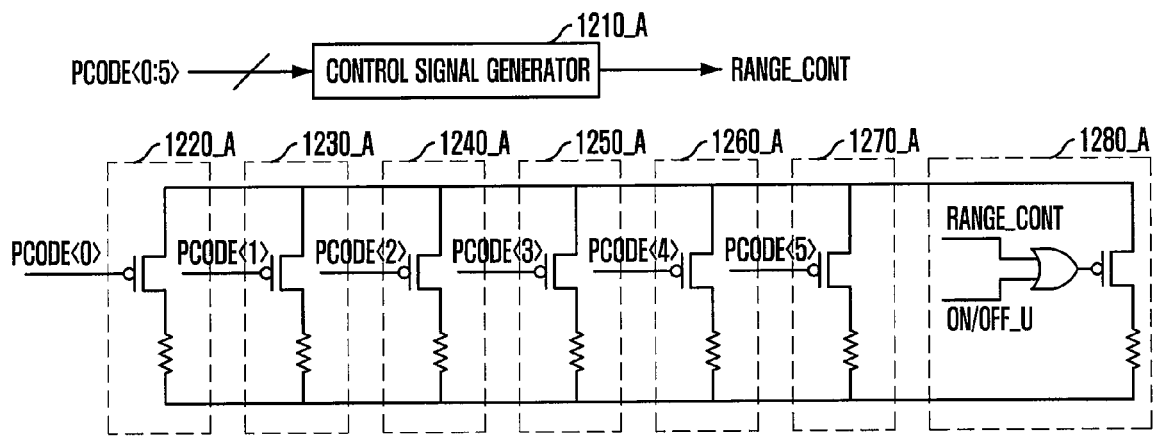
FIGS. 12A and 12B illustrate a termination resistance circuit in accordance with a second embodiment of the present subject matter.
Figure 12B:
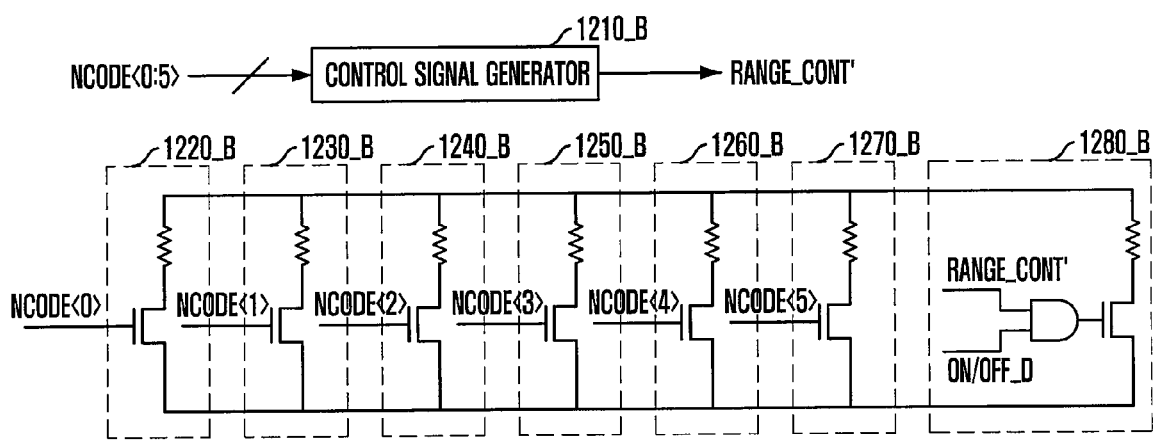

FIGS. 12A and 12B illustrate a termination resistance circuit in accordance with a second embodiment of the present subject matter.

FIG. 12A illustrates a case that the termination resistance circuit is a pull-up termination resistance circuit, and FIG. 12B illustrates a case that the termination resistance circuit is a pull-down termination resistance circuit. Both of them basically have the same configuration except that they are different in the type of transistors used and the codes PCODE<0:5> and NCODE<0:5> inputted. Of course, the termination resistance circuit of FIG. 12A may be used as a pull-down termination resistance circuit, and the termination resistance circuit of FIG. 12B may be used as a pull-up termination resistance circuit, ignoring deterioration in characteristics.

FIGS. 12A and 12B are different only in that the levels of input signals are different from each other due to the difference in the type of transistors used. Hence, the termination resistance circuit in accordance with the second embodiment will now be described with reference to FIG. 12A.

The termination resistance circuit in accordance with the second embodiment includes a plurality of parallel resistors 1220_A~1270_A turned on/off in response to their calibration code PCODE<0:5> and a reference resistor 1280_A whose on/off state is changed if the calibration code PCODE<0:5> has a predetermined code value.

When the calibration code PCODE<0:5> reaches a predetermined code value, a control signal generator 1210_A changes the logic level of a control signal RANGE_CONT, and maintains the changed logic level until the termination resistance circuit is reset. Such a control signal generator 1210_A can have the same configuration as in FIG. 7A or FIG. 8A.

The reference resistor 1280_A is turned on or off in response to the control signal RANGE_CONT. Thus, the range of resistance values of the termination resistance circuit varies depending on whether the reference resistor 1280_A is turned on or off. When comparing FIG. 12A with FIG. 6, it can be seen that the reference resistor 1280_A corresponds to the resistance value changing unit 630.

Referring to FIGS. 12A and 12B, it can be seen that the reference resistor 1280_A receives a control signal RANGE_CONT and an ON/OFF_U signal by logically combining them by an OR gate. As explained in the background art, all the resistors of the termination resistance circuit sometimes need to be turned off regardless of the calibration code PCODE<0:5> value or the like. For example, in case that the termination resistance circuit is applied to an output driver, when no data is outputted, all the resistors must be turned off. The ON/OFF_U signal is used in this case. Since the ON/OFF_U signal has already been described in the background art, a description thereof will be omitted here. When the termination resistance circuit does not perform a termination operation, the reference resistor is turned off because the reference resistor is controlled by the ON/OFF_U signal as well. (Of course, in this case, the other resistors are turned off, too).

In case that the termination resistance circuit performs a termination operation, the ON/OFF_U signal will have a 'low' level. Thus, the on/off of the reference resistor 1280_A is determined only by the control signal RANGE_CONT.

The second embodiment has the same features and effects as the termination circuit of the first embodiment except that the range of resistance values of the termination resistance circuit is changed by using the method of turning on/off the reference resistor 1280_A. Thus, further detailed description will be omitted.

Figure 13A:
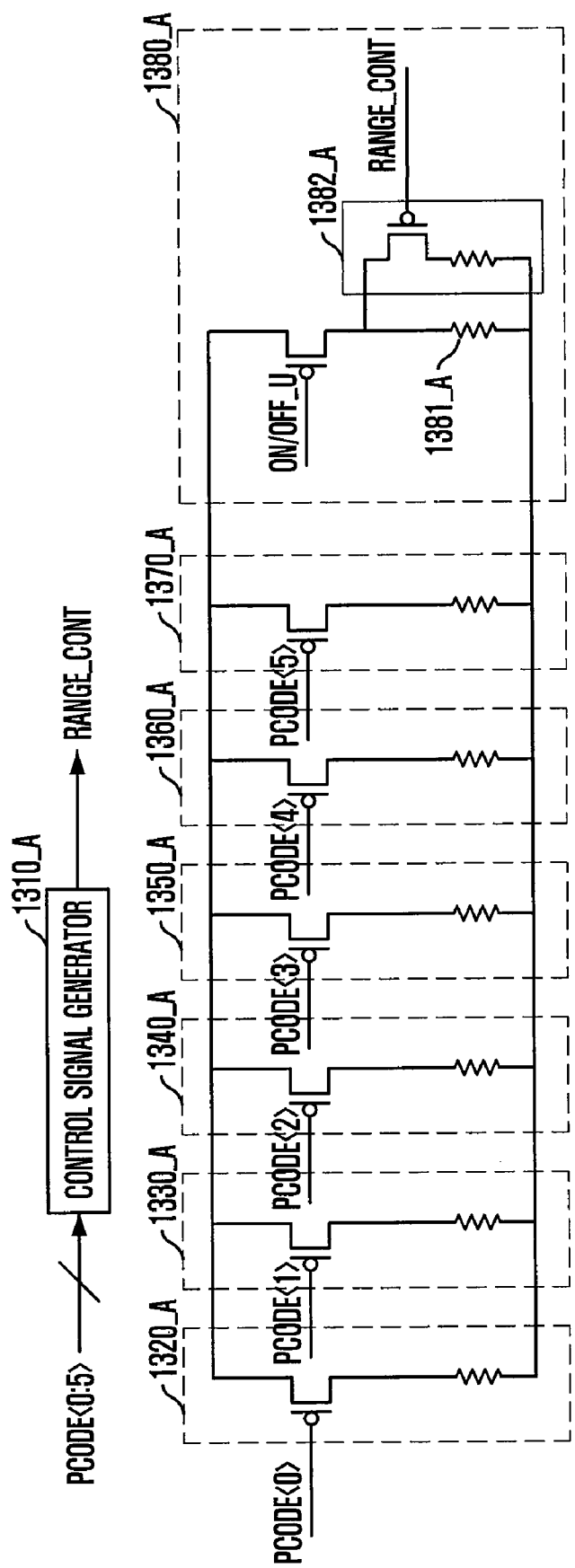
FIGS. 13A and 13B illustrate a termination resistance circuit in accordance with a third embodiment of the present subject matter.
Figure 13B:
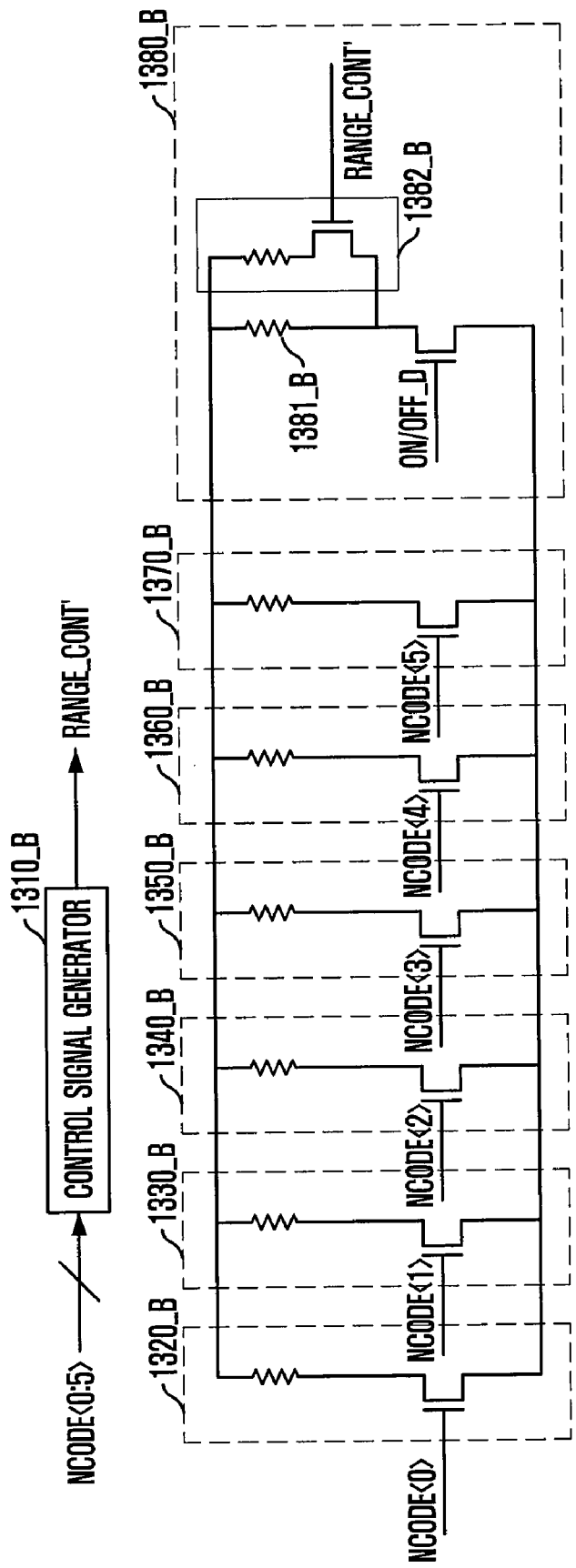

FIGS. 13A and 13B illustrate a third embodiment of a termination resistance circuit in accordance with the present subject matter.

FIG. 13A illustrates a case that the termination resistance circuit is a pull-up termination resistance circuit. FIG. 13B illustrates a case that the termination resistance circuit is a pull-down termination resistance circuit. Both of them basically have the same configuration except that they are different in the type of transistors used and the codes PCODE<0:5> and NCODE<0:5> inputted. Of course, the termination resistance circuit of FIG. 13A may be used as a pull-down termination resistance circuit, and the termination resistance circuit of FIG. 13B may be used as a pull-up termination resistance circuit, ignoring deterioration in characteristics.

FIGS. 13A and 13B are different only in that the levels of input signals are different from each other due to the difference in the type of transistors used. Hence, the termination resistance circuit according to the third embodiment will now be described with reference to FIG. 13A.

The termination resistance circuit in accordance with the third embodiment includes a plurality of parallel resistors 1320_A~1370_A turned on/off in response to their calibration code PCODE<0:5> and a reference resistor 1380_A for maintaining the range of resistance values of the termination resistance circuit. The resistance value of the reference resistors 1380_A is changed when the calibration code PCODE<0:5> has a predetermined code value.

When the calibration code PCODE<0:5> reaches a predetermined code value, a control signal generator 1310_A changes the logic level of a control signal RANGE_CONT, and maintains the changed logic level until the termination resistance circuit is reset. Such a control signal generator 1310_A can have the same configuration as in FIG. 7A or FIG. 8A.

The reference resistor 1380_A is turned on or off in response to the ON/OFF_U signal. As stated above, it can be considered that the reference resistors 1380_A is always turned on because the ON/OFF_U signal always maintains a 'low' level when the termination resistance circuit performs a termination operation. However, since a changing resistor 1382_A in the reference resistor 1380_A is turned on/off by the control signal RANGE_CONT, the resistance value of the reference resistor 1380_A is changed depending on a logical value of the control signal RANGE_CONT.

When the resistance value of the reference resistor 1380_A is changed depending on the control signal RANGE_CONT, the range of resistance values of the termination resistance circuit is changed. When comparing FIG. 13A with FIG. 6, it can be seen that the resistance value changing unit 630 is included in the reference resistor 1380_A. That is, the changing resistor 1382_A corresponds to the resistance value changing unit 630.

The third embodiment has the same features and effects as the termination circuits of the first and the second embodiments except that the range of resistance values of the termination resistance circuit is changed by using the method of changing the resistance value of the reference resistor 1380_A. Thus, further detailed description will be omitted.

As described above, the termination resistance circuit in accordance with the present subject matter changes the range of resistance values of the resistance circuit when a calibration code has a predetermined value. Thus, the present subject matter has an advantage of increasing the range of resistance values of the resistance circuit while maintaining the resolution.

While the present subject matter has been described with respect to the specific embodiments, it will be apparent to those skilled in the art that various changes and modifications may be made without departing from the spirit and scope of the invention as defined in the following claims.

What is claimed is:

1. A termination resistance circuit, comprising:
   a control signal generator to receive a calibration code, generate a control signal, and change a logic value of the control signal when the calibration code has a predetermined code value;
   a plurality of parallel resistors which are respectively turned on/off in response to the calibration code; and
   a resistance value changing unit to change a range of the total resistance value of the termination resistance circuit in response to the control signal,
   wherein the resistance value changing unit includes a switch unit and changes the range of the total resistance value of the termination resistance circuit by turning on the switch unit when the calibration code has the predetermined value.

2. The termination resistance circuit of claim 1, wherein, when a logic value of the control signal is changed during an operation of the termination resistance circuit, the control signal generator maintains the changed logic value of the control signal until resetting.

3. The termination resistance circuit of claim 1, wherein, when the calibration code is a code for making the total resistance value of the plurality of parallel resistors to fall below a predetermined value, the control signal generator generates the control signal so that the resistance value changing unit decreases a previous minimum value of the total resistance value of the termination resistance circuit.

4. The termination resistance circuit of claim 1, wherein the resistance value changing unit includes a reference resistor and the switch unit that are connected in series and the switch unit is configured to turn off when some but not all of the plurality of parallel resistors are turned on and turn on when all of the plurality of parallel resistors are turned on.

5. A termination resistance circuit, comprising:
   a plurality of parallel resistors which are respectively turned on/off in response to a calibration code; and
   a control signal generator configured to receive the calibration code, generate a control signal, and change a logic value of the control signal when the calibration code has a predetermined code value,
   wherein, at least one of the plurality of parallel resistors includes a switch unit and changes a range of the total resistance value of the termination resistance circuit by turning on the switch unit when the calibration code has the predetermined code value.

6. The termination resistance circuit of claim 5, wherein the parallel resistor whose resistance value is changed is the one with the largest resistance value among the parallel resistors.

7. The termination resistance circuit of claim 5, wherein, if the resistance value of the parallel resistor is changed once, the changed resistance value is maintained until resetting.

8. The termination resistance circuit of claim 5, wherein, when the calibration code is a code for making the total resistance value of the plurality of parallel resistors to fall below a predetermined value, the resistance value of the parallel resistor is decreased.

9. The termination resistance circuit of claim 5, wherein the switch unit is configured to turn off when some but not all of the parallel resistors are turned on and turn on when all of the plurality of parallel resistors are turned on.

10. The termination resistance circuit of claim 5, wherein the control signal generator includes:
    a logic combination unit for logically combining the calibration codes to generate the control signal; and
    a latch unit for receiving a reset signal and maintaining a level of the control signal until resetting in response to the reset signal.

11. The termination resistance circuit of claim 5, wherein the parallel resistor whose resistance value is changed includes:
    a basic resistor; and
    a changing resistor which is connected in parallel or in series to the basic resistor and turned on/off in response to the control signal.

12. A termination resistance circuit, comprising:
    a plurality of parallel resistors which are respectively turned on/off in response to a calibration code; and
    a reference resistor whose on/off state is changed when the calibration code has a predetermined code value, wherein the reference resistor configured to turn off when some but not all of the parallel resistors are turned on and turn on when the plurality of parallel resistors are all turned on.

13. The termination resistance circuit of claim 12, wherein the plurality of parallel resistors each comprise a switch and a resistance connected in series that are together coupled in parallel to the series-connected switch and resistance of the other parallel resistors of the plurality of parallel resistors, the reference resistor includes a switch and a resistance connected in series that are together coupled in parallel to the resistance of the parallel resistor of the plurality of parallel resistors, and the switch of the reference resistor has a terminal coupled to an intervening node of the switch and the resistance of the parallel resistor.

14. The termination resistance circuit of claim 12, wherein the reference resistor is turned on when the calibration code has a code value for making the total resistance value of the plurality of parallel resistors to fall below a predetermined value.

15. The termination resistance circuit of claim 12, wherein the reference resistor is turned off when the calibration code has a code value for making the total resistance value of the plurality of parallel resistors to rise above a predetermined value.

16. The termination resistance circuit of claim 12, wherein, when the calibration code has the predetermined code value and the on/off state of the reference resistor is changed once, the on/off state is maintained until resetting.

17. The termination resistance circuit of claim 12, further comprising a control signal generator to receive a calibration code, generate a control signal, and change a logic value of the control signal when the calibration code has the predetermined code value,
    wherein the reference resistor is turned on/off in response to the control signal.

18. The termination resistance circuit of claim 17, wherein the control signal generator includes:

a logic combination unit for logically combining the calibration codes to generate the control signal; and a latch unit for receiving a reset signal and maintaining the level of the control signal until resetting in response to the reset signal.

19. A termination resistance circuit, comprising:

a plurality of parallel resistors which are respectively turned on/off in response to a calibration code; and a reference resistor for controlling a range of the total resistance value of the termination resistance circuit, wherein a resistance value of the reference resistor is changed when the calibration code has a predetermined code value, wherein the reference resistor includes a switch unit and changes the range of the total resistance value of the termination resistance circuit by turning on the switch unit when the calibration code has the predetermined code value.

20. The termination resistance circuit of claim 19, wherein the switch unit is configured to turn off when some but not all of the parallel resistors are turned on and turn on when all of the plurality of parallel resistors are turned on.

21. The termination resistance circuit of claim 19, wherein, when the calibration code has a code value for making the total resistance value of the plurality of parallel resistors to fall below a predetermined value, a resistance value of the reference resistor is decreased.

22. The termination resistance circuit of claim 19, wherein, when the calibration code has a code value for making the total resistance value of the plurality of parallel resistors to rise above a predetermined value, a resistance value of the reference resistor is increased.

23. The termination resistance circuit of claim 19, wherein, if a resistance value of the reference resistor is changed once, the changed resistance value is maintained until resetting.

* * * * *